United States Patent [19]

Bourner

[11] 4,229,701
[45] Oct. 21, 1980

[54] PULSE ORDER RECOGNITION CIRCUIT

[75] Inventor: Malcolm S. Bourner, Maidstone, England

[73] Assignee: Kent County Council, Maidstone, England

[21] Appl. No.: 901,012

[22] Filed: Apr. 27, 1978

[30] Foreign Application Priority Data

Apr. 29, 1977 [GB] United Kingdom ............... 18149/77

[51] Int. Cl.³ .............................................. H03K 5/22
[52] U.S. Cl. ................................. 328/10 G; 307/232; 328/133
[58] Field of Search ............... 328/109, 133, 119, 139; 307/232, 295; 324/83 D

[56] References Cited

U.S. PATENT DOCUMENTS

| | | | |
|---|---|---|---|
| 3,646,455 | 2/1972 | Coccagna | 328/10 G |
| 3,798,556 | 3/1974 | Ooya et al. | 328/133 |
| 3,904,894 | 9/1975 | Ciolli | 328/133 |

Primary Examiner—Stanley D. Miller, Jr.
Assistant Examiner—B. P. Davis
Attorney, Agent, or Firm—Cooper, Dunham, Clark, Griffin & Moran

[57] ABSTRACT

A circuit which has two inputs at which respective ones of two time-displaced pulses may be received. The circuit also has an output at which a signal is produced if the pulses arrive in one order but not if they arrive in the opposite order. The circuit may have a second output at which a signal is produced if they arrive in said opposite order but not if they arrive in said one order. If spaced apart movement sensors are used to provide the two input signals, the circuit having two outputs indicates in which of two directions an object such as a vehicle passes the sensors. If only a single output is employed the circuit indicates each object passing in one direction but ignores objects passing in the opposite direction. Further applications of the circuit are disclosed.

11 Claims, 10 Drawing Figures

PULSE ORDER RECOGNITION CIRCUIT

FIELD OF THE INVENTION

This invention relates to a circuit for receiving two or more pulses displaced in time relative to each other and responding in a characteristic manner depending upon which of the pulses is received first, and more particularly to a device for detecting direction of movement of an object by using such a circuit.

BACKGROUND OF THE INVENTION

The background of the invention lies in the problems which are encountered in measuring traffic flow on roads, using automatic equipment. Such equipment employs a sensor placed in or on a road surface, which produces an output signal in response to passage of a complete vehicle, or of a vehicle wheel, over the sensor. The equipment also includes means for counting these signals so as to provide an indication of the volume of traffic that has passed over the sensor. Various kinds of sensors have been used, including pneumatic tubes and inductive loops. A deformable tube is secured across the road surface in the path of the traffic to be counted and each time a vehicle wheel passes over the tube a pulse of increased pressure occurs in the tube as it is deformed. The pressure pulse is applied to a pressure-sensitive electric switch which generates an electrical pulse which serves as the input signal to the counting equipment.

It has been a significant problem with such equipment, whatever type of sensor has been employed, that it cannot distinguish, from the output signal, in which direction a vehicle has passed over the sensor. This problem does not arise on a single-direction roadway such as a motorway lane, where all the vehicles will necessarily be moving in the same direction, but it arises to various degrees in other situations. For example, on a road carrying a single lane of traffic in one direction and a single lane of traffic in the opposite direction, a sensor can be placed in one lane only in an attempt to measure the traffic flow in only one direction, or separate sensors can be placed in the two lanes in an attempt to separately measure the traffic flows in the two opposite directions; however, there are always a significant number of occasions when vehicles are travelling on the wrong side of the road, at least to a sufficient extent to operate the wrong sensor, such as when overtaking. The result is that the count of vehicles derived from a sensor includes some which were not actually travelling in the direction which that sensor was intended to sense for. The problem is even more significant in a traffic lane which has no preferential direction, such as the centre lane of a three-lane two-direction road, or a narrow country road, in both of which cases vehicles travelling in either direction will use the same part of the roadway. In these situations, all that can be obtained is a total count from which no information as regards the individual flows in the two different directions can be obtained.

SUMMARY OF THE INVENTION

It will become apparent that the present invention provides a device which substantially overcomes this problem, and which also enables direction-sensing to be achieved in other fields than traffic measurement, and which further may be applied in fields where no sensing of direction of movement is involved.

An aspect of the invention is a circuit which has first and second inputs at which may be received respective ones of two electrical pulses displaced relative to each other (at least as regards their leading edges) in time, at least one output, means for providing at the output an output signal when the pulses are received at the inputs in the order first-second, and means preventing said output signal at the output when the pulses are received at the inputs in the order second-first. Preferably, as will become apparent, the first input and the output are linked by a transmission channel through which the pulse received at the first input is simply transmitted to the output, possibly with modifications in its waveform, and means are provided for blocking that channel when a pulse is received at the second input before the pulse is received at the first input. It will be appreciated that an output pulse at said output is only provided in response to two input pulses when the first input receives the earlier input pulse, and not when the first input receives the later input pulse.

The invention further provides a device for sensing direction of movement in which two sensors, each adapted to produce an electrical pulse (if necessary by employing a suitable transducer) in response to the movement of a body past the sensor, are arranged to respond in succession to passage of a body along a path, and consequently to produce two pulses in succession, and the pulses are applied respectively to the first and second inputs of a circuit as has been described above. The order in which the two sensors produce their pulses will depend on the direction in which the body travels along its path. Whether or not the circuit provides an output signal at its output depends on which of its first and second inputs receive the first of the two pulses, and consequently an object moving in one direction relative to the sensors causes the circuit to produce an output pulse, whereas an object moving in the opposite direction does not. By adopting sensors suitable for sensing vehicles, and locating them in a road lane carrying vehicles in both directions, the output signal appearing at the output of the circuit will be responsive to all vehicles travelling in one direction over the sensors, but not to any vehicles travelling in the opposite direction over the sensors, and hence direction-selective vehicle counting can be achieved.

Most vehicle sensors in fact produce a pulse for the passage of each vehicle axle, rather than each actual vehicle, but statistical information is readily available from which a count of axles can be converted quite accurately to a count of vehicles.

A preferred circuit in accordance with the invention, for example as will be described in detail below, has a second output corresponding with its second input, means for providing an output signal at the second output when the first of the two pulses is received at the second input, and means for preventing provision of said output signal at the second output when the first of the two pulses is received at the first input. Thus, as applied to direction sensing, each output signal at the first output corresponds with an object moving in one direction, while each output signal at the second output corresponds with an object moving in the opposite direction.

From a further aspect of the invention, a two (or more) channel pulse transmitting circuit is provided with means for re-setting it to its original condition after it has been operated to block one of its channels against transmission of the later pulse.

The re-setting means may be responsive to the second input pulse to cause said re-setting automatically after the second input pulse has been received.

This is particularly advantageous when counting vehicles, or in other situations where the events being sensed may occur in very rapid succession, because the circuit automatically conditions itself to sense the next event immediately the preceding event has finished.

Where overlapping input pulse may occur, the invention provides for removal of the overlap so that a distinct second pulse is available for automatic resetting.

Alternatively, but preferably in addition, timed re-setting means is provided for re-setting the circuit a predetermined time after it has been put into a condition to block one of the two input pulses. Such an arrangement, alone, is not desirable when a rapid succession of events may need to be sensed, because the time delay before re-setting must be made long enough to cover the longest expected time interval between the two pulses, otherwise the circuit will provide an output signal in response to both of a relatively widely spaced pair of pulses, with the result that the circuit may not then be ready to respond correctly to a second pair of input pulses which occur very soon after a first pair.

Preferably, as in the circuit to be described in detail below, a time-delay re-setting means is provided in addition to an automatic re-setting means triggered by the second pulse, so that if by any chance the second pulse does not occur the circuit will nevertheless be re-set after a predetermined period.

A further aspect of the invention lies in a method of and apparatus for detecting direction of movement of an object by having two sensors spaced apart along the path of the object, comprising providing respective signals as the object acts on each sensor, and detecting which sensor provides the first of the signals, whereby the direction of movement of the object along the path is determined.

A further feature of the invention is the determination of speed of movement of an object by measurement of the time elapsing between the signals from two such sensors, so that if desired the speed as well as direction of movement of each object, such as a vehicle, can be monitored.

In the above discussion, only two sensors, and two input signals, have been referred to, but it should be appreciated that the invention is capable of employing more than two sensors, and a corresponding number of input pulses or signals, and arrangements for this purpose will be described in detail below.

BRIEF DESCRIPTION OF THE DRAWINGS

In order that the invention may be more clearly understood, preferred embodiments thereof will now be described, by way of example, with reference to the accompanying diagrammatic drawings, in which:

DETAILED DESCRIPTION OF EMBODIMENTS

Figure 1:
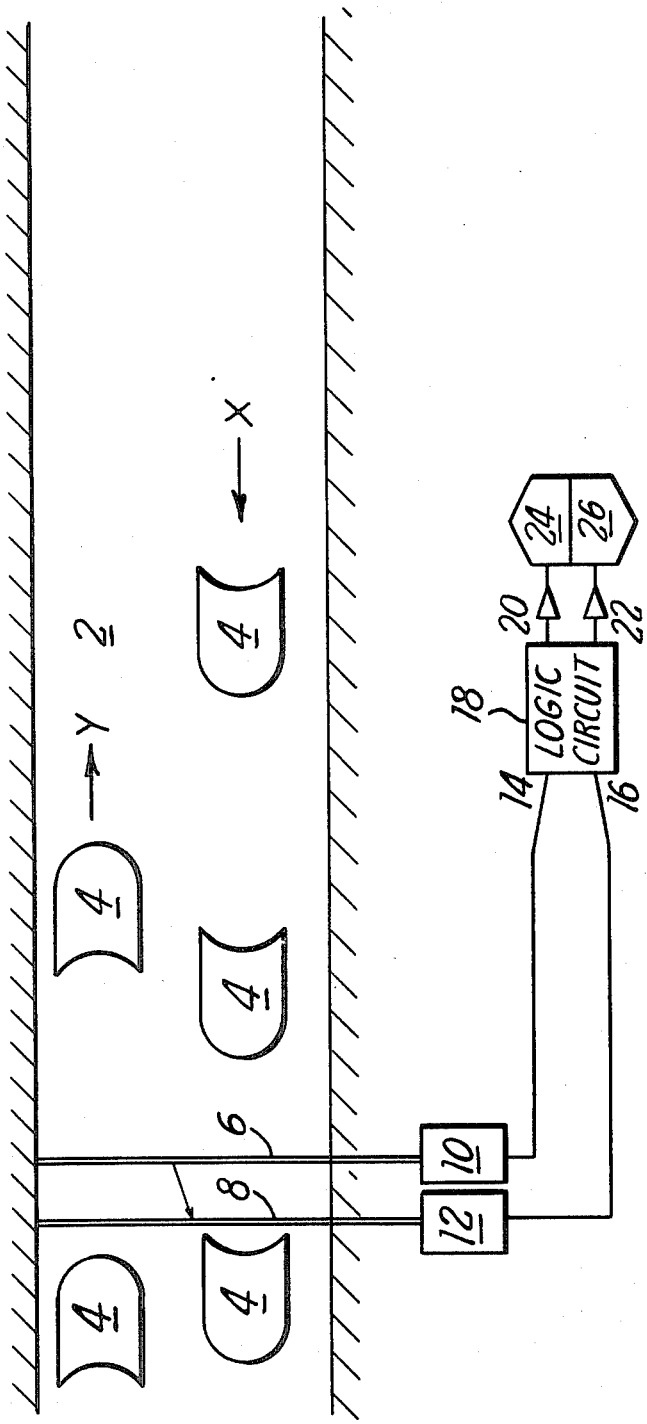
Figure 2:
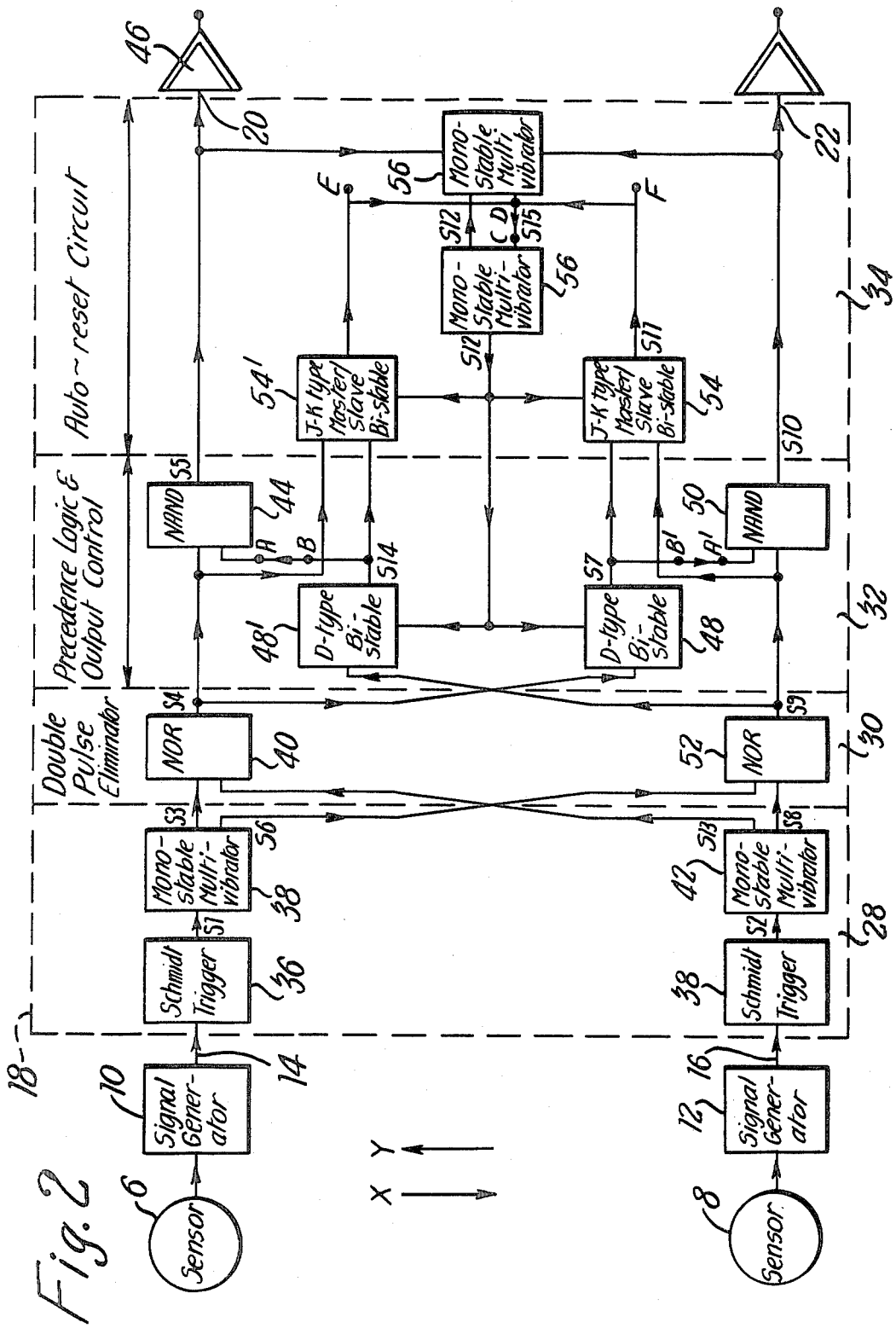
Figure 3:
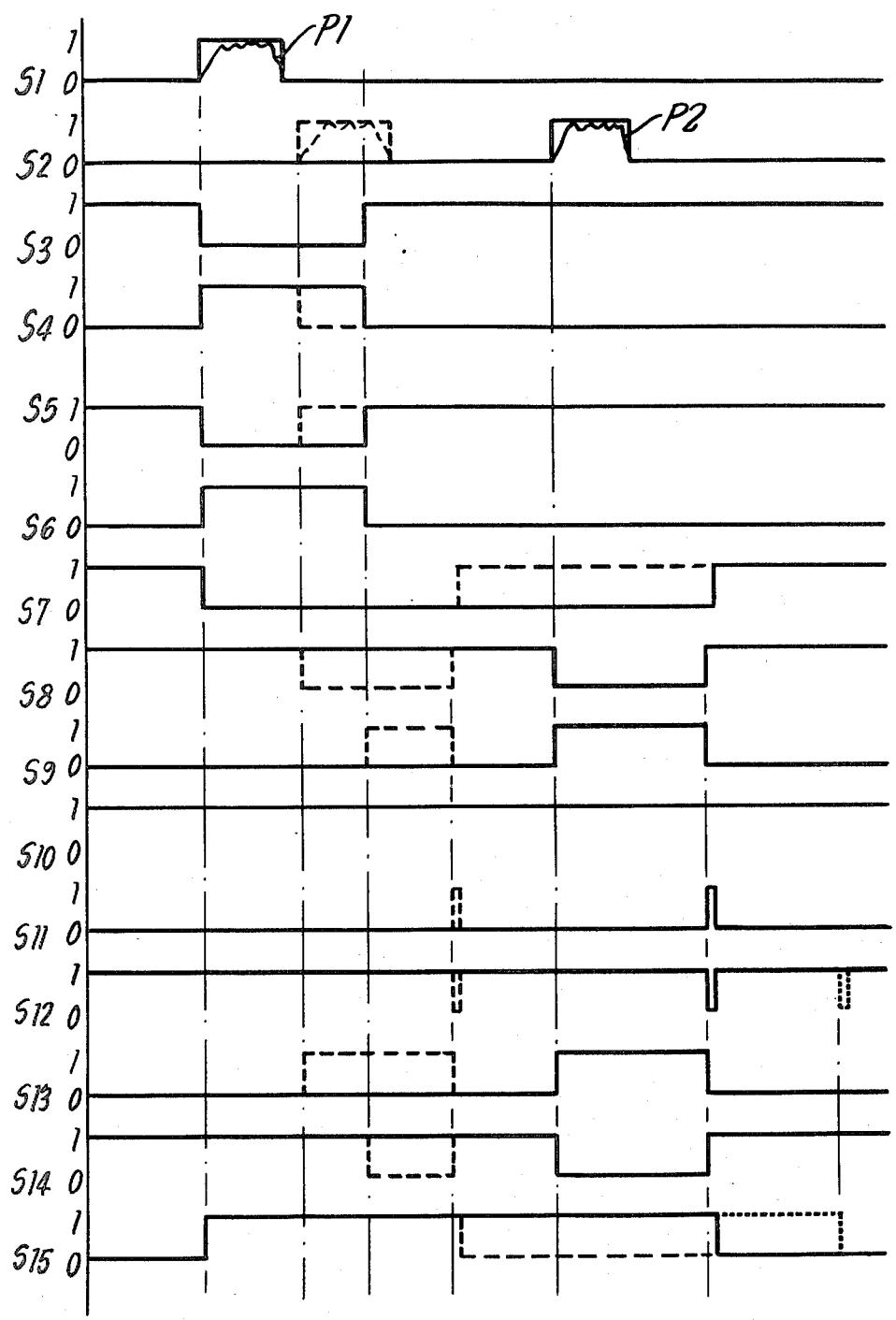
Figure 4:
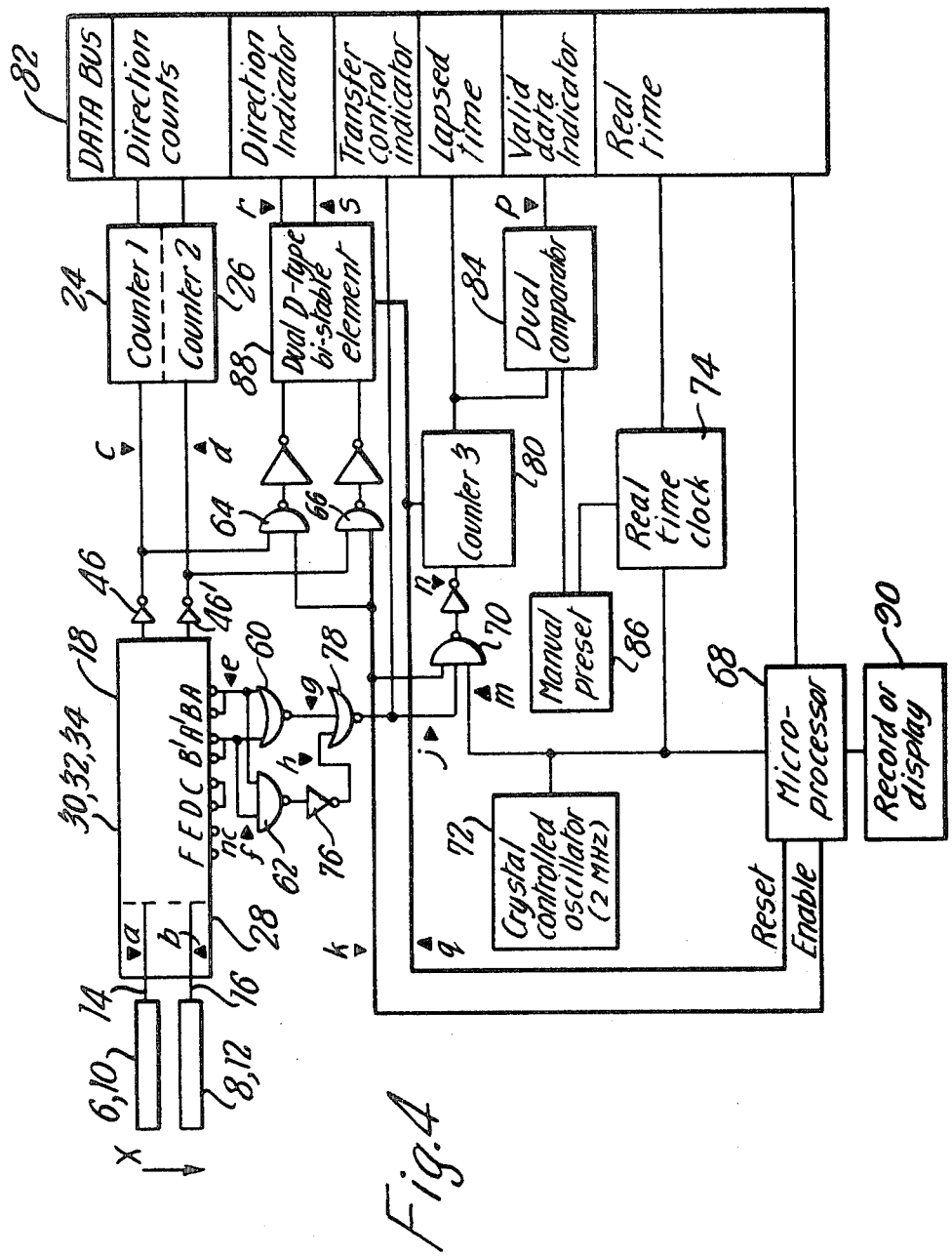
Figure 5:
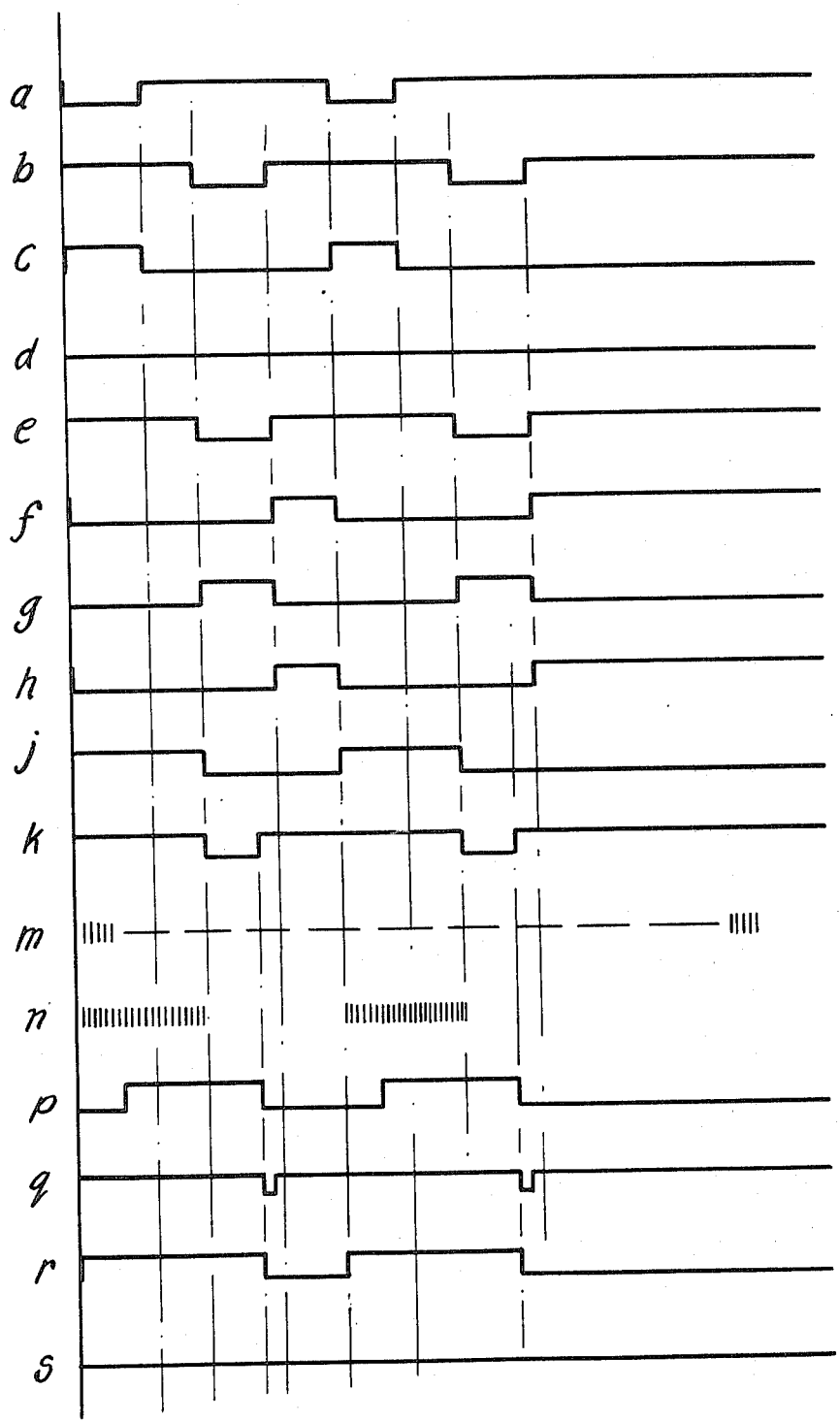
Figure 6:
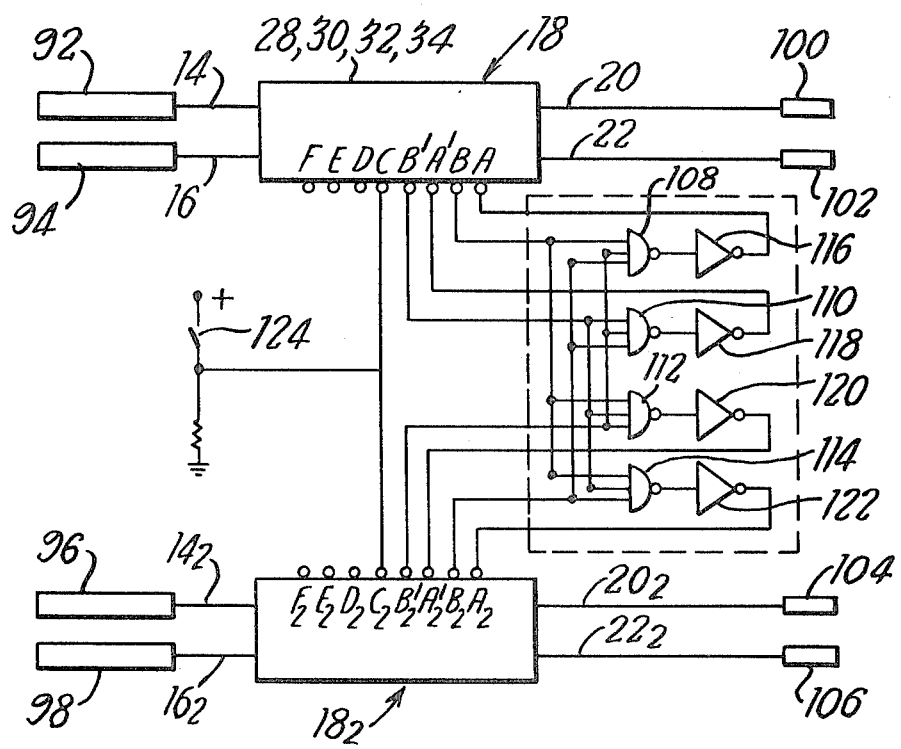
Figure 7:
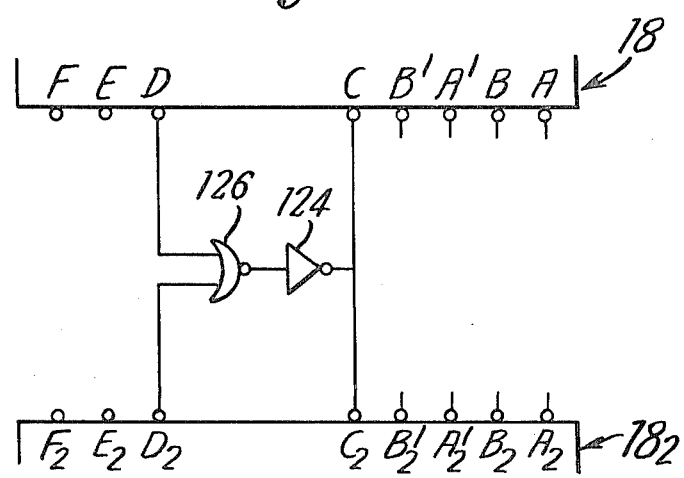
Figure 8:
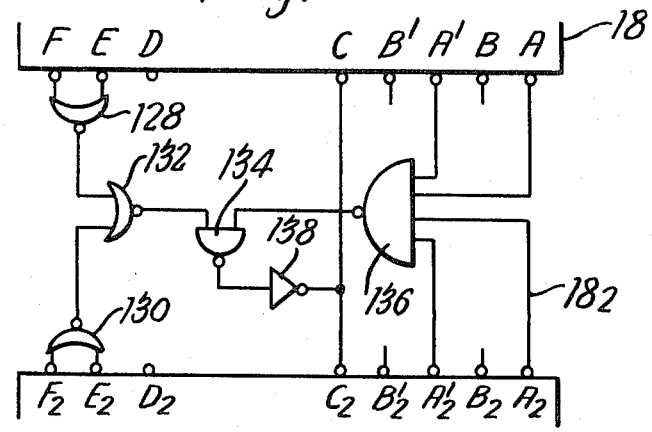
Figure 9:
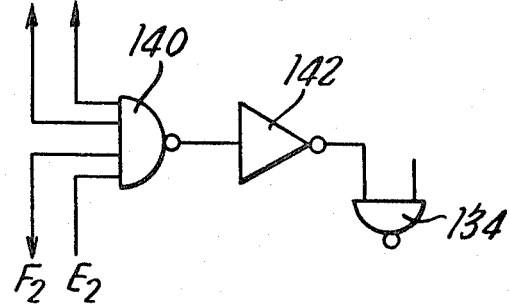

FIG. 1 illustrates a direction-sensitive traffic measurement system employing the invention;

FIG. 2 shows a circuit in accordance with the invention, and suitable for use in the system of FIG. 1;

FIG. 3 is a timing diagram showing the signal conditions at different points in the circuit of FIG. 2, during the handling of a pair of pulses by that circuit;

FIG. 4 is a schematic diagram of apparatus for measuring vehicle flow and also vehicle speed, utilising a circuit as shown in FIG. 2;

FIG. 5 is a wave-form diagram relating to the operation of the apparatus shown in FIG. 4;

FIG. 6 shows a pair of circuits as in FIG. 2, coupled together to handle input signals from four sensors;

FIGS. 7 and 8 show two alternative automatic re-setting arrangements which can be utilised in place of manual re-setting in the apparatus of FIG. 6;

FIG. 9 shows a modification of FIG. 8; and

Figure 10:
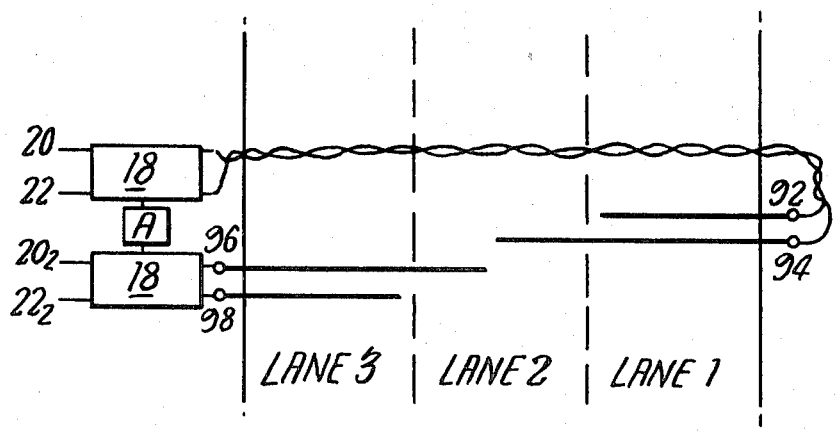

FIG. 10 shows an application of the arrangement of FIGS. 6 and 7.

Referring to FIG. 1, there is shown a road 2 which carries vehicles 4 in both directions. Equipment embodying the invention is provided for measuring the flow of vehicles in each direction, and comprises two sensors in the form of pneumatic tubes 6 and 8 extending completely across the road and spaced apart from each other, each tube being coupled to a suitable signal generator, 10 and 12, such as a pneumatically operated electric switch, and the signal generators 10 and 12 having their outputs connected to first and second inputs 14 and 16 of a logic circuit 18 which has two outputs 20 and 22 connected to respective units 24 and 26. As will become apparent, the logic circuit 18 produces at its output 20 a pulse for each vehicle axle which crosses the sensors 6 and 8 in the direction X, but not in the direction Y, and unit 24 is arranged to treat these signals in any desired manner, and normally at least to count them. Unit 26 carries out the same function in respect of the signals from output 22 which represent the number of vehicle axles crossing the sensors 6 and 8 in the direction Y, but not in the direction X. The spacing between the sensors 6 and 8 is such that when a vehicle crosses them the resulting pulses from signal generators 10 and 12 will have a readily recognisable displacement in time relative to each other, bearing in mind the likely range of speeds of the vehicles. Typically, the distance may be about 1 m. Where a similar system is to be employed for sensing the movement of other objects, the distance between the sensors will be suitably set having regard to the likely speed of the objects.

In FIG. 2 the logic circuit 18 is shown within a broken-line block, in more detail, with the first sensor 6 and signal generator 10 connected to its first input 14 and the second sensor 8 and signal generator 12 connected to its second input 16. The logic circuit 18 can be regarded as consisting of four sections, namely an input section 28, for shaping the input pulses for application to the remainder of the circuitry, a double pulse eliminator section 30 the function of which will be described below, a precedence logic and output control section 32 and an automatic re-set section 34.

The operation of the logic circuit 18 will now be described in detail with reference to FIGS. 2 and 3. FIG. 3 shows how the signal level changes at various points in the circuit of FIG. 2 when a vehicle wheel runs over both the sensors 6 and 8 in that order. The different wave-forms occurring are indicated by references S1 to S15 and the positions in the circuit at which they occur are indicated by the same references S1 to S15 in FIG. 2.

When a vehicle passes over sensor 6, then over sensor 8, the sensors cause the signal generators 10 and 12 to generate at their outputs respective ill-defined pulses which are indicated at P1 and P2 in FIG. 3 and which are displaced from each other in time, pulse P1 occurring before pulse P2. These two pulses are applied to the respective inputs 14 and 16 of the logic circuit 18.

Schmidt trigger circuits 36 and 38 receive the respective input pulses P1 and P2 and in response to their leading edges produce well-defined square pulses S1 and S2. Pulse S1 occurs first, so its effect upon the circuit will be considered first.

Pulse S1 is applied to a mono-stable multi-vibrator 38. The upper output of mono-stable 38 is normally at "1" as can be seen at S3 in FIG. 3. The leading edge of pulses S1 causes S3 to become "0" for a period dependent on the characteristics of mono-stable 38. In practice, this period is selected to be longer than the original ill-defined pulse P1 so that correct operation of the circuit is not disturbed by peaks which may occur in the trailing portion of the original pulse P1. In traffic measurement, pulse P1 might typically last about 35 ms and mono-stable 38 is set to produce a pulse about 40 ms long, as pulse S3.

A NOR gate 40 has S3 applied to one of its inputs and in the normal state of the circuit is receiving a "0" (S13) at its other input from a mono-stable 42 in the other channel of the circuit, so in response it produces an output pulse S4 of the same length as pulse S3. S4 is applied to one input of a NAND gate 44 the other input of which is normally receiving a "1" (S14), as will later become apparent, so that its output is a negative-going pulse S5 of the same length as pulses S3 and S4. S5 appears at the output 20 of logic circuit 18, where it may if desired be converted to a positive-going pulse by an invertor 46.

Because pulse P1 was the first of the two input pulses to arrive, it passes straight through to the corresponding output 20 and in doing so sets the circuit 18 to a condition in which the later-arriving pulse P2 from sensor 8 will not be passed through to output 22, in a manner which will be described in detail below, and in consequence the output pulse appearing at output 20 is indicative of the fact that the vehicle crossed sensors 6 and 8 travelling in direction X. Had it been travelling in direction Y, the opposite would have occurred i.e. the first pulse would have come from sensor 8 and gone through to output 22 while the second pulse would have been prevented from getting from sensor 6 to output 20, the pulse at output 22 thereby indicating a vehicle travelling in direction Y.

The way in which suppression of the second-arriving pulse is achieved will now be described.

The pulse S4 from the output of NOR gate 40, caused by the first input pulse, is applied to a D-type bistable 48 causing its output, normally at "1", to go to "0" as shown at S7. S7 is applied to one input of a NAND gate 50 in the second channel of circuit 18. The output S10 of NAND gate 50 is normally at "1" and so long as S7 applied to its input remains at "0", to which it has just been set as described, its output S10 cannot become "0" even though the second input pulse P2 becomes applied to its other input via Schmidt trigger 38, mono-stable 42 and a NOR gate 52 corresponding with NOR gate 40 in the other channel. The response of these elements to the second pulse P2 is indicated by the wave-forms S2, S8 and S9 but it can be seen from FIG. 3 that the pulse S9 does not cause the output of NAND gate 50 to change so the second input pulse is not transmitted through to output 22.

However, the second input pulse does serve to automatically re-set the circuit back to its original condition so that it is ready to respond to the next pair of input pulses. The first input pulse set the output of bistable 48 to "0" (S7) and this was applied to one input of a J-K bistable 54. This had no immediate effect on the output S11 of bistable 54 but conditioned bistable 54 to respond to the next "1" occurring at its other input. That "1" is pulse S9 corresponding to the second input pulse P2 to be applied to the circuit, and it causes the output S11 of bistable 54 to go to "1". S11 is applied to a mono-stable multi-vibrator 56 and causes its output S12 to go temporarily to "0". S12 is applied to bistable 48 and bistable 54 to set them back to their original conditions.

Though not previously mentioned, bistable 48' had changed its condition (S14), but this is not relevant when the first input pulse comes from sensor 6. The change in S14 also enabled J-K bistable 54' but did not cause its output (normally at "0" as in the case of bistable 54) to change. Bistables 48' and 54' are also re-set to their original condition by S12.

It will thus be appreciated that all the circuitry which has been described is re-set to its original condition in response to arrival of the second input pulse from sensor 8.

There is also provided a time-delay re-setting arrangement in case the second input pulse should not arrive. It has been found that this can occur because a very light vehicle, such as a motor-cycle, may have its wheels bounced upwardly sufficiently, upon hitting the first sensor, that it does not hit the second sensor hard enough to actuate it. The time-delay re-setting arrangement comprises a mono-stable multi-vibrator 56 whose output S15 is normally "0" but is set to "1" by the first input pulse P1. In the normal circumstances which have been described above, where the second input pulse P2 does arrive and thereby causes signal S12 to re-set the circuitry, S12 is also applied to mono-stable 56 so as to re-set it along with the rest of the circuitry, so that mono-stable 56 has no re-setting effect. However, in the absence of such re-setting mono-stable 56 remains at "1" for a period which is set to be longer than the period taken by the slowest expected vehicle to pass between the sensors 6 and 8 and at the end of that period its output S15 automatically goes back to "0" as indicated by the dotted portion of S15 in FIG. 3. This "0" is applied to mono-stable 56 causing it to generate the re-set pulse S12 as shown by the dotted-line version of S12 in FIG. 3, and this delayed pulse S12 re-sets the remainder of the circuitry in the same manner as the pulse S12 shown in full lines, as described above.

As just described, the two input pulses P1 and P2 were sufficiently spaced that the longer pulses S3 and S8 did not overlap. In these circumstances, the double pulse eliminating section 30 of the circuit has no effect and both pulses can pass through the NOR gates 40 and 52.

However, in the case of a fast-moving vehicle pulse P2 can arrive while pulse S3 is still present. This situation is indicated in broken-lines at S2 in FIG. 3 and the other broken line portions of wave-forms, when this happens.

In the event of pulse S3 overlapping pulse S8 and the "double pulse eliminator" circuit being omitted, pulse S3 would trigger bistable 48 which in turn would enable bistable 54. Similarly, pulse S8 would trigger bistable 48' and subsequently enable bistable 54' before pulse S3 (S4) had passed through the NAND gate 44. Bistable 54 having been enabled would thus be triggered by the trailing edge of pulse S3 (S4) so re-setting the circuits.

By so doing the NAND gate 50 would be enabled while pulse S8 (S9) was still present at its input and thus the tail end of pulse S8 (S9) would pass through gate 50 so yielding an output pulse at 22, there having been already a pulse at output 20. The "double pulse eliminator" circuit described below avoids this.

When the first pulse (S3) reaches the NOR gate 40, the output from the mono-stable 42 (S13) is normally low (0) and thus output S4 goes high. When the second pulse S8 is generated, output S13 goes high causing output S4 of gate 40 to go low. Thus the pulse S3 is truncated to pulse S4 as it passes through the gate 40. Similarly while S3 is low the other output S6 is high so pulse S8 is prevented from passing through the NOR gate 52. When S3 returns to its normal high state, output S6 of mono-stable 38 returns to the low state so enabling the remaining portion of pulse S8 to pass through 52 as S9. The two pulses S3 and S8 are thus processed so that they emerge from circuit 30 as two time separated pulses S4 and S9 respectively and the following circuitry responds to them in the manner described above.

In the sequence described above, with input pulses P1 and P2 relatively widely spaced, shutting of NAND gate 44 by the leading edge of pulse S9 does occur, but of course it does not matter because by that time pulse S4 has passed through the gate. Both gate 44 and 50 are re-opened, of course, ready for the next pair of pulses, by the re-setting of bistables 48 and 48' as has already been described.

As can be seen from FIG. 2, the circuit 18 is symmetrical, and so its manner of operation when a vehicle travelling in direction Y passes over sensors 8 and 6 in that order in the exact complement of what has just been described in relation to a vehicle going in the direction X.

FIG. 4 shows a further developed form of the device shown in FIGS. 1 and 2, for detecting not only the direction of travel of vehicles being counted, but also the speed of each vehicle.

The circuit 18 is shown as a single block and the units 24 and 26 coupled to its outputs are counters. Links A–B, A'–B', and C–D, and tapping points E and F are shown on one side of the block 18 and these items are identified by the same letters in FIG. 2. In the configuration shown in FIG. 4 it can be seen that outputs are taken from points A and A' and applied on the one hand to a NOR gate 60 and also to a NAND gate 62. Tappings are also taken from the outputs of invertors 46 and 46' to the inputs of two NAND gates 64 and 66. The connections of the circuitry can readily be seen in FIG. 4, so will not be described further. The functioning of the arrangement shown in FIG. 4 will now be described with reference to FIG. 5, which is a timing diagram in which the wave-forms indicated by a to s are those at the points indicated by the same letters in FIG. 4. Pulses a and b are the lengthened pulses produced by the mono-stables 38 and 42 in the circuit 18 and correspond with pulses S3 and S8 in FIG. 3.

FIG. 5 illustrates the response of the circuitry to two axles of one vehicle passing in the direction X over sensors 6 and 8, the first axle producing the first pulse a and the first pulse b and the second axle producing the second pulse a and the second pulse b. It can be seen that each pulse a is delivered from circuit 18 as a pulse c which is applied to and counted by counter 24, which is the counter for axles travelling in direction X. The trailing pulse b does not emerge from the output of circuit 18 and so signal d does not include any pulses so that neither of the axles travelling in direction X causes counter 26 to count, counter 26 being the counter for axles going in direction Y.

The circuitry is controlled by a micro processor 68 and for purposes of explanation it should be assumed that micro processor 68 is initially supplying an enable signal k to one input of each of NAND gates 64 and 66 and to one input of a three-input NAND gate 70. A crystal controlled oscillator 72 is continuously supplying pulses at a high frequency e.g. 2 MHz to the micro processor 68 where they serve as clock pulses for operating the micro processor, to a real time clock 74 and to another of the inputs of NAND gate 70. These 2 MHz pulses are indicated by m.

Before the leading pulse a arrives e and f are both high. These two signals are operated on by the NOR gate 60 and the NAND gate 62 followed by an invertor 76, and the outputs of 76 and 60 are applied to a NOR gate 78 which produces a low signal at its output thus disabling NAND gate 70 so that pulses from oscillator 72 cannot go through to a counter 80. The leading edge of leading pulse a causes A' to go low (signal f) which, through NAND gate 62, invertor 76 and NOR gate 78, causes the output of NOR gate 78 to go high as shown at j. j going high opens NAND gate 70 so that the 2 MHz pulses m are applied through an invertor to the counter 80 which begins to count those pulses.

The trailing edge of the leading pulse a does not cause any change in the output j of NOR gate 78, but when the leading edge of the trailing pulse b arrives it causes signal e at point A to go low. This causes the output of NOR gate 78 (signal j) to go low, which disables the NAND gate 70 and stops the train of 2 MHz pulses being applied to counter 80. Consequently, counter 80 only counts pulses during the period which elapses from the arrival of the leading edge of pulse a to the arrival of the leading edge of pulse b. This corresponds with the time taken by the vehicle to travel between sensors 6 and 8. The counter delivers the lapsed time signal to the data bus 82 as shown at the right of FIG. 4.

The lapsed time signal from counter 80 is also applied to one input of a dual comparator 84 which is provided with pre-settable high and low acceptable lapsed time values from a manual pre-set device 86. If the comparator finds that the measured lapsed time lies within the acceptable range defined by the pre-set device 86, it issues a valid data signal to the data bus 82. If the measured lapsed time signal is outside those limits an invalid data signal is given to the data bus. The reason for this is that a very long elapsed time is unlikely to correspond to a vehicle of interest and it is useful for this information to be provided to the data bus. The same applies to a very low elapsed time which is likely to correspond with two vehicles hitting the sensors simultaneously travelling in opposite directions, which is unlikely but which can occur. Again, the data bus is advised that such a measurement is not valid. Comparator 84 does not generate pulse until the minimum elapsed time, as set by manual pre-set 86, has passed.

While the above is occurring, the two NAND gates 64 and 66 having been enabled by the micro processor, one or other of them receives an input signal either from invertor 46 or from invertor 46'. In the case described, the signal will come from invertor 46, because the vehicle is travelling in direction X, and this signal c causes gate 64, via an invertor, to switch a dual D-type bistable element 88 into a condition producing an output signal r indicative of a vehicle travelling in direction X. This signal is applied to data bus 82. Had the vehicle been going in the other direction gate 66 would have been changed to cause bistable element 88 to produce a high signal s indicative of a vehicle travelling in direction Y, but it can be seen from FIG. 5 that this has not occurred in the particular circumstances being discussed.

As explained, at the end of the elapsed time, the signal j goes low and this is signalled to a transfer control indicator in the data bus 82 and from there to the micro processor 68, which then cuts off the enable signal k to the gates 64, 66 and 70. The micro processor is programmed so as to then cause the information in the data bus to be handled in any suitable way, for example recorded or displayed in a record or display unit 90, and/or put into the memory of and/or processed by the micro processor, while signal k is still low. This information will be the cumulative number of X direction counts and of Y-direction counts from counters 24 and 26, the direction (X or Y) of the vehicle which has just been counted, the elapsed time in respect of the vehicle which has just been counted (which, if suitably programmed, the micro processor can convey to a speed reading) an indication of whether the data relating to the vehicle just counted is valid or not, and the time of day at which the vehicle was counted.

Then, the micro processor issues a re-set signal q to the counter 80 and the bistable element 88, so that both these components are cleared ready for sensing of the next axle, and restores its enable signal k. In FIG. 5, the second axle of the vehicle is travelling of course in the same direction as the first one, so that the same pattern of signals throughout the circuit is repeated.

The system of FIG. 4 can be extended, according to a further feature of the invention by providing timing circuitry for measuring the elapsed time between successive output pulses from the first channel of circuit 18, or the second channel, or separately for each channel. Each vehicle would produce a group of such pulses depending on the number of axles on the vehicle. The information thus gathered as regards elapsed time between axles may be recorded and used to compute spacing between axles. It is known that vehicles can be classified by type on the basis of axle-spacing information, and the information for doing so is known. This feature of the invention, therefore provides the information needed for classifying the vehicles passing over the sensors, and the actual classification may be carried out by the micro processor in FIG. 4, so that direction, speed and type, of each vehicle passing over the sensors may be recorded or displayed.

FIG. 6 shows an arrangement for receiving four input pulses and permitting only the first of them to arrive to pass through to its corresponding output stage. The arrangement utilises two circuits of the kind shown at 18 in FIG. 2. The upper circuit has been given references the same as those used in FIG. 2, while the lower circuit has been given the same references, but with the addition of the suffix "2".

The arrangement shown in FIG. 6 may be used, for example, to indicate which of four people is the first to answer a question in a quiz game. Each of the four people is provided, for example, with a respective switch 92, 94, 96 and 98 which produces a pulse when operated, and which is connected in place of the sensors and signal generators 6, 8, 10 and 12 of FIG. 2. The outputs 20, 22, $20_2$ and $22_2$ are connected to respective output stages capable of responding to the output signals of the circuits, such as indicator lights indicated at 100, 102, 104 and 106.

The points A, B, etc. shown in FIG. 2 are also indicated on the circuits 18 and $18_2$ in FIG. 6 and the two circuits 18 and $18_2$ are interconnected by removing the links A–B, A'–B' and C–D (see FIG. 2) and then interconnecting the points A to C and $A_2$ to $C_2$ utilising NAND gates 108 to 114 and invertors 116 to 122 as shown in FIG. 6.

With this arrangement, the first of four input pulses delivered from sensors 92 to 98 causes a pulse (for example S7 in FIG. 3) to be delivered from one of the terminals B, B', $B_2$ or $B'_2$ (depending on which of the four inputs receive the first input pulse) to those three of the NAND gates 108 to 114 which correspond with the other three channels of the device, whereupon those three NAND gates, through their associated invertors, deliver signals to those three of the terminals A, A', $A_2$, $A'_2$ which corresponds with the other three channels, so as to close the NAND gates (corresponding with gates 44 and 50 in FIG. 2) in those other three channels. Consequently, the first pulse to arrive at one of the four inputs goes through to the corresponding one of the four output stages 100 to 106, while the following input pulses cannot get through to their corresponding output stages.

The circuit as shown in FIG. 6 does not re-set itself, so a manual re-set switch 124 is provided which, when temporarily closed, applies a positive signal to terminals C and $C_2$ to cause re-setting of circuits 18 and $18_2$ as already described in relation to FIG. 2.

It should be noted that any number of inputs can be interconnected in the manner shown in FIG. 6. For example, to handle 2 n inputs, n circuits 18 would be employed, with 2 n NAND gates, each NAND gate having its output connected through an ivertor to a respective one of the A and A' terminals and each NAND gate having $(2n-1)$ inputs, these being connected to all the B and B' terminals of the circuits 18, except that B or B' which is in the same channel as the A or A' terminal to which that NAND gate provides its output.

FIG. 7 shows a modification of the arrangement in FIG. 6, in which, instead of a manual re-set circuit applying a re-set pulse to terminals C and $C_2$ of the circuits 18 and $18_2$, these two terminals are connected through an invertor 124 and a NOR gate 126 to the terminals D and $D_2$ of the two circuits 18 and $18_2$. All the remaining connections and interconnections would be as shown in FIG. 6.

In this arrangement, the first input pulse passes through to its respective output and closes the other three channels as already described, while the second input pulse causes an output pulse to be produced either at terminal D or terminal $D_2$ (depending upon which of the circuits 18 and $18_2$ it arrives at) which through NOR gate 126 and invertor 124 causes a pulse to be applied at terminals C and $C_2$ to re-set both circuits 18 and $18_2$. Thus, only the first pulse gets through to its output stage, and the second pulse causes resetting of the circuits.

The arrangement of FIG. 7 may be applied to counting vehicles in each lane of a three lane highway, e.g. one carriageway of a dual 3-lane motorway as shown in FIG. 10. 18 are the logic units, A is the interconnection arrangement of FIGS. 6 and 7, and 92, 94, 96 and 98 are the sensors and signal generators. Under this arrangement output 20 would give the count in Lane 1, output 22 the count in Lane 2 and output 20₂ the count in Lane 3. Output 22₂ would not be used.

In the further modification of the FIG. 6 circuit, shown in FIG. 8, all the interconnections shown in FIG. 6 would be present except for the manual re-set arrangement, which is replaced by the additional connections shown in FIG. 8. In this arrangement, only the first input pulse to arrive passes through to its corresponding output, the others being blocked, and both circuits 18 and 18₂ produce signals at either their E terminal or their F terminal. This may occur in response to the second input pulse to arrive, and must definitely occur in response to the third input pulse to arrive. As can be seen from FIG. 8, the circuitry required includes three NOR gates 128, 130 and 132, two NAND gates 134, and 136, and an invertor 138.

In FIG. 9, a modification of the FIG. 8 circuit is shown in which the three NOR gates 128, 130 and 132 are replaced by a single NAND gate 140 having four inputs, and an invertor 142 having its output connected to the left-hand input of the NAND gate 134. This circuit again lets through only the first input pulse to arrive, but it is not re-set until input pulses have been received at all four of the inputs.

The only specific sensors which have been referred to, for producing input signals to be processed by the circuitry described, have been pneumatic tubes acting on pressure switches, and also directly operated electrical switches. Any other device capable of producing an electric pulse in response to the occurrence of some event might, however, be used. For example a piezoelectric transducer operated by a force generated by the event, a photo-electric transducer receiving a beam of radiation at any wave length, the beam being broken in response to the event being monitored, a resistor, inducer, or capacitor, whose value is modulated by the event being monitored, an ultrasonic beam in conjunction with a suitable ultrasonic sensor, the beam being broken by the event being monitored, a reed relay operated by passage of a magnet close to the relay, or a Hall effect device responding to passage of a magnet.

Hall effect is the production of a transverse voltage across a conductor carrying a current when placed in a magnetic field. A Hall effect probe can be used directly to produce a pulse e.g. a magnet on a rotating wheel passing a Hall effect probe would produce a pulse.

Among the two-way movements which the circuit may be employed to monitor are:
(a) people or vehicles passing in and out of a single entrance/exit car park;
(b) traffic passing along a two-way highway;
(c) people walking along footpaths/pavements;
(d) trains and trams passing over a single track;
(e) pallets passing back and forth along a pneumatic or hydraulic pipe way;
(f) boats passing up and down river;
(g) movement of people, goods or vehicles in and out of buildings.

The invention can also be used to control opening and closing of garage doors or other barriers. One pair of sensors would be placed inside, and one pair outside the garage, each pair having a logic circuit. The doors would be automatically opened in response to either logic circuit indicating a vehicle approaching the doors (from inside or outside) and closed in response to either sensor indicating a vehicle leaving the doors (again from either inside or outside). More simply, only one pair of sensors may be used, outside, and a manual open/close control inside.

The invention also comprises sensing the direction of rotation of bi-directional rotational elements such as the shafts of lathes or lift motors. In such cases, a pair of sensors will be employed plus something which operates the two sensors in one order when the member rotates in one direction and in the opposite order when the member rotates in the opposite direction. For example two light beams may be passed through the teeth of a gear wheel on to two photocells, or two Hall effect probes placed adjacent a wheel or shaft carrying a magnet.

Such arrangements may be employed not only to indicate in what direction rotation is occurring but also, by counting pulses, to measure how many rotations have occurred in each direction. By arranging to subtract the counts for one direction from those for the other direction, an indication of rotational position relative to an original reference position may also be obtained and, furthermore, by adding any suitable circuitry for responding to pulse rate, an indication of speed of rotation can also be obtained.

What is claimed is:

1. A pulse order recognition circuit having a quiescent condition and comprising first and second inputs for receiving when the circuit is in said quiescent condition respective ones of two electrical pulses displaced relative to each other in time, at least one output, means for providing at said output an output signal in response to the earlier of said pulses being received at said first input and the later of said pulses being received at said second input, means for preventing said output signal from being provided at said output in response to the earlier of said pulses being received at said second input and the later of said pulses being received at said first input, said providing means and said preventing means being adapted to so operate irrespective of whether the two pulses overlap in time, or not, and means responsive to said later pulse for resetting the circuit to said quiescent condition ready to receive a further two said pulses.

2. A circuit as claimed in claim 1, wherein said first input and said output are linked by a signal transmission channel and means is provided for blocking said channel in response to the earlier of said pulses being received at said second input.

3. A circuit as claimed in claim 1, having a second output, means for providing at said second output an output signal in response to the earlier of said pulses being received at said second input and the later of said pulses being received at said first input, and means for preventing said output signal being provided at said second input in response to the earlier of said pulses being received at said first input and the later of said pulses being received at said second input.

4. A circuit as claimed in claim 3, wherein said first input and said output are linked by a signal transmission channel and means is provided for blocking said channel in response to the earlier of said pulses being received at said second input, said second input and said second output are linked by a second signal transmission channel and means is provided for blocking said second channel in response to the earlier of said pulses being received at said first input.

5. A circuit as claimed in claim 2, wherein said re-setting means is responsive to the later pulse to re-set said blocking means to an unblocked condition.

6. A circuit as claimed in claim 4, wherein said re-setting means is responsive to the later pulse to re-set to an unblocking condition either of the blocking means which has been set to a blocking condition.

7. A circuit as claimed in claim 6, comprising means for eliminating a portion of a pulse in one said channel which overlaps a pulse in the other said channel thereby separating, in time, the pulses in the channels and providing a later pulse distinct from the earlier pulse for re-setting said blocking means.

8. A circuit as claimed in claim 2, comprising further re-setting means for re-setting said blocking means to an unblocked condition after a predetermined delay period.

9. A circuit as claimed in claim 6, comprising further re-setting means for re-setting said blocking means to an unblocked condition after a predetermined delay period.

10. In combination, a pulse order recognition circuit as claimed in claim 1, two sensors each adapted to produce a pulse in response to movement of a body past the sensor, the sensors being positioned to respond in succession to passage of a body along a path and thereby to produce two pulses in succession, and means coupling the sensors respectively to the first and second inputs of the pulse order recognition circuit, whereby to distinguish movement of said body in one direction along said path from movement in an opposite direction.

11. In combination, a pulse order recognition circuit as claimed in claim 3, two sensors each adapted to produce a pulse in response to movement of a body past the sensor, the sensors being positioned to respond in succession to passage of a body along a path and thereby to produce two pulses in succession, and means coupling the sensors respectively to the first and second inputs of the pulse order recognition circuit, whereby to provide at one output output signals indicative of a body travelling in one direction, and at the other output signals indicative of a body travelling in the opposite direction.

* * * * *